(12) United States Patent
Boldt

(10) Patent No.: US 6,704,676 B2
(45) Date of Patent: Mar. 9, 2004

(54) METHOD AND CIRCUIT CONFIGURATION FOR IDENTIFYING AN OPERATING PROPERTY OF AN INTEGRATED CIRCUIT

(75) Inventor: Sven Boldt, München (DE)

(73) Assignee: Infineon Technologies AG, Munich (DE)

(*) Notice: Subject to any disclaimer, the term of this patent is extended or adjusted under 35 U.S.C. 154(b) by 75 days.

(21) Appl. No.: 10/053,983

(22) Filed: Jan. 22, 2002

(65) Prior Publication Data
US 2002/0099512 A1 Jul. 25, 2002

(30) Foreign Application Priority Data
Jan. 19, 2001 (DE) .......................... 101 02 349

(51) Int. Cl.[7] .............. G06F 19/00; G11C 7/00
(52) U.S. Cl. ............ 702/117; 365/201; 377/20; 702/123
(58) Field of Search ............. 702/66, 67, 117, 702/119, 123; 324/73.1, 76.77, 121 R; 365/185.03, 201, 233; 377/123; 257/48

(56) References Cited

U.S. PATENT DOCUMENTS

| | | | | |
|---|---|---|---|---|
| 4,603,405 A | * | 7/1986 | Michael | 365/201 |
| 5,563,928 A | * | 10/1996 | Rostoker et al. | 377/20 |
| 6,125,336 A | * | 9/2000 | Brunelle | 702/123 |
| 6,130,442 A | | 10/2000 | Di Zenzo et al. | 257/48 |

FOREIGN PATENT DOCUMENTS

DE    44 06 510 C1    7/1995

* cited by examiner

Primary Examiner—Michael Nghiem
Assistant Examiner—John Le
(74) Attorney, Agent, or Firm—Laurence A. Greenberg; Werner H. Stemer; Gregory L. Mayback

(57) ABSTRACT

An operating property of the integrated circuit, such as its speed class, value is determined during testing. In order to identify the integrated circuit with a value for its operating property, there are provided at least two registers whose outputs are logically combined bit by bit via OR gates. The registers are preferably programmable with fuses. In a first test run, the first register is programmed with the ascertained value of the operating property, and the second register is correspondingly programmed in a second test run. The logic combination enables the less significant value of the operating property to predominate. The storage of this value on the integrated circuit itself simplifies the later identification on the housing of the integrated circuit.

8 Claims, 1 Drawing Sheet

METHOD AND CIRCUIT CONFIGURATION FOR IDENTIFYING AN OPERATING PROPERTY OF AN INTEGRATED CIRCUIT

BACKGROUND OF THE INVENTION

Field of the Invention

The invention lies in the integrated circuit technology field. More specifically, the invention relates to a method for identifying an operating property of an integrated circuit, wherein, in at least one test sequence, the operating property is ascertained and then output. The invention also pertains to a corresponding circuit configuration.

Integrated circuits are tested for functionality after fabrication. To that end, the integrated circuit is connected to an automatic test machine and changed over to a test mode. The automatic test machine operates the circuit with different input stimuli under a wide variety of operating conditions and compares the result calculated by the circuit in the test mode with a predetermined reference value. The circuit can thereby be operated with the application of supply voltages of different magnitudes, different temperatures and/or different clock frequencies.

A characteristic operating property of an integrated semiconductor memory, in particular of an SDRAM (Synchronous Dynamic Random Access Memory), is the operating speed of the memory. SDRAMs which are offered for different speed classes usually comprise the same circuit. The dictates of fabrication give rise to variations in the quality of the circuit, so that one portion of the chips operates reliably at a higher speed and another portion of the chips operates reliably only at a lower operating speed. In practice, a plurality of speed classes are appropriate, for example up to eight speed classes for SDRAMs. The speed class is marked on the housing of the module and sold with this stipulation to customers for incorporation into electronic systems, e.g. computers.

During the fabrication and testing of the integrated circuit, care must be taken to ensure that an integrated circuit originally provided for a lower speed class is not incorrectly marked for a higher speed class. This is made particularly more difficult by the fact that the application of the speed class on the housing of the integrated circuit is usually effected at a different location than the testing of the circuit. The test results are thus previously stored in databases. In order to determine the previously defined speed class for marking the integrated circuit, the database must be accessed and the individual number of the module must be compared with the content of the database.

U.S. Pat. No. 6,130,442 describes a semiconductor memory chip which has registers that are programmable in nonvolatile manner in order to store operating properties, for example the speed. German published patent application DE 44 06 510 describes an integrated circuit with a concomitantly integrated test device.

SUMMARY OF THE INVENTION

It is accordingly an object of the invention to provide a method and also a circuit configuration for identifying an operating property of an integrated circuit, which overcomes the above-mentioned disadvantages of the heretofore-known devices and methods of this general type and which enable a simpler procedure in the course of the identification.

With the foregoing and other objects in view there is provided, in accordance with the invention, a method for identifying an operating property of an integrated circuit, which comprises:

ascertaining the operating property of the integrated circuit in a first test run, assigning a first digital identifier to a first value of the operating property thus ascertained, and permanently storing the first value in a first memory element;

subsequently ascertaining the operating property again in a second test run, assigning a second digital identifier to a second value of the operating property thus ascertained, and permanently storing the second value in a second memory element; and logically combining the digital identifiers in bit-by-bit ORing of bits of the digital identifiers to form an output identifier, and marking the integrated circuit in dependence on the output identifier.

In accordance with an added feature of the invention, the marking step comprises applying a marking to a housing of the integrated circuit.

In accordance with an additional feature of the invention, the operating property ascertained in the first test run or the second test run is a clock frequency of the integrated circuit at which the integrated circuit operates without any faults. For the purpose of ascertaining the fault-free operation, input data are fed to the integrated circuit and output data are tapped off from the integrated circuit as a response to the input data. The output data are then compared with predetermined comparison data.

In accordance with another feature of the invention, the memory elements of the integrated circuit may be preset to mutually complementary values prior to the first test run.

With the above and other objects in view there is also provided, in accordance with the invention, a circuit configuration for identifying an operating property of an integrated circuit, wherein at least two test runs of a functional test of the integrated circuit are performed for ascertaining the operating property, and the operating property is identified in dependence on the at least two test runs, comprising:

a first memory element for permanently storing a digital value depending on the first of the test runs, the first memory element having an output; and a second memory element for permanently storing a digital value depending on the second of the test runs, the second memory element having an output; and a logic combination element with a logic OR function, the logic combination element having an input side connected to the output of the first memory element and to the output of the second memory element, and having an output side for outputting a logically combined digital value.

In accordance with a further feature of the invention, the output side of the logic combination element is formed with a plurality of outputs for tapping off the logically combined digital value in parallel.

In accordance with a concomitant feature of the invention, the logic combination element comprises a respective OR gate for each bit position of the digital values, and the OR gates each have an input connected to an output bit of the memory element.

In other words, the objects are achieved, with regard to the method, by means of a method for identifying an operating property of an integrated circuit, wherein, in a first test run, the operating property is ascertained and a first digital identifier assigned to the ascertained value of the operating property is permanently stored in a first memory element and then, in a second test run, the operating property is ascertained again and a second digital identifier assigned to the ascertained value of the operating property is permanently stored in a second memory element and the stored digital identifiers are logically combined by means of bit-by-bit ORing of the bits of the digital identifiers to form an identifier to be output, depending on which the integrated circuit is provided with an assigned marking.

With regard to the circuit configuration, the objects are achieved by means of a circuit configuration for identifying an operating property of an integrated circuit depending on at least two test runs of a functional test of the integrated circuit, which test ascertains the operating property, comprising: a first memory element for permanently storing a digital value depending on the first of the test runs, and a second memory element for permanently storing a digital value depending on the second of the test runs, and a logic combination element which forms a logic OR function and, on the input side, is connected to outputs of the memory elements and, on the output side, is provided with outputs for tapping off a logically combined digital value.

The data representing the operating property, for example the speed class of the integrated circuit, are stored in a nonvolatile manner on the integrated circuit itself. Therefore, a complicated adjustment with a database is not necessary for this purpose. The location at which the test is carried out and the location at which the housing is identified with the assigned value of the operating property can be far away from one another. The information about the identification is always stored on the chip. It is possible to store at least two identifications for the tested operating property on the integrated circuit, the two identifications being logically combined. Through a suitable choice of the logic combination it is then possible that, when carrying out the second test and writing the identification to the integrated circuit, at most a deterioration can take place, but not an improvement. This ensures that an integrated circuit which was assigned to a certain speed class in a first test is at most assigned to the same or even to a lower speed class, but not to a higher speed class, in a subsequent second test. The invention both increases the security in the identification of the integrated circuit depending on the tested operating property and reduces the logistical outlay for providing the value of the identification.

The identification method can be used particularly advantageously for identifying the speed class of an SDRAM. The speed class specifies that clock frequency at which the SDRAM still operates completely correctly. It is usually marked on the housing. By virtue of the permanent programming of the speed class in the integrated circuit, it can even be interrogated electronically in the application.

For the speed test, the integrated circuit is connected to an automatic test machine and supplied with input data. In response, the integrated circuit calculates an output result, which is either compared with predetermined, expected comparison data directly on the chip or is output to the automatic test machine in order to be compared there with the reference data. Depending on the comparison result, a decision is made as to whether or not the integrated circuit functions correctly. This test is carried out at different operating clock frequencies and can also additionally be carried out under varying further parameters, such as varying supply voltage or varying temperature. On the basis of agreed specifications, a decision is then made as to the speed class wherein the integrated circuit is to be classified. The invention ensures that, in the case of tests that proceed multiply one after the other, the speed class never increases, but rather can only decrease.

The logic combination with which the register contents representing the tested value are logically combined with one another is expediently an OR logic combination. By way of example, if the logic value "0" is assigned to the most significant or best case of the measured operating parameter and the most significant logic value "11 . . . 1" is assigned to the least significant or worst case of the measured operating parameter, then the bit-by-bit ORing of the register outputs has the effect that the value devoted to the least significant operating parameter always predominates. Two three-bit registers enable the allocation of eight speed classes. The highest speed class is represented by the register value "000". The least significant speed class is represented by the register value "111". Each individual bit of the first register is logically QRed with the corresponding bit of the second register. If the value for the speed class that was determined from a first test run was stored in the first register and a second test run is subsequently carried out and the speed class determined during the latter is stored in the second register, then the result available at the output, owing to the OR logic combination, can at most have the lower of the two speed classes determined, but not the higher.

The presetting of the registers is to be chosen in such a way that one of the registers has the lowest speed setting, that it to say the value "111", and that the other of the registers has the highest speed class, that is to say the value "000". The value which can be tapped off at the output of the circuit then corresponds to the lowest speed class in accordance with the presetting.

Fuses are provided for programming the registers. Fuses are connections which can be programmed to be either blocked or conducting by an energy pulse. The energy pulse can be impressed by means of an electric current, in a so-called electrical fuse, or by means of a laser, in a so-called laser fuse. As a result, a logic "1" or logic "0" can be permanently programmed. By way of example, a fuse is conducting in the unprogrammed state and connects a signal connection to ground. A pull-up resistor connects the signal connection to the positive supply potential. Consequently, a logic "0" is preset. If the fuse is interrupted by means of an energy pulse, then the pull-up resistor pulls the connection, in terms of potential, to the positive supply potential and impresses a "1". For the other register, the fuse is connected between the connection and the positive supply potential, and a pull-down resistor connects the connection to ground. A "1" is preset. If the fuse is interrupted, then a "0" is programmed. With the use of an antifuse, which is programmed to be conducting by an energy pulse, the opposite conditions are correspondingly applicable.

Other features which are considered as characteristic for the invention are set forth in the appended claims.

Although the invention is illustrated and described herein as embodied in a method and circuit configuration for identifying an operating property of an integrated circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
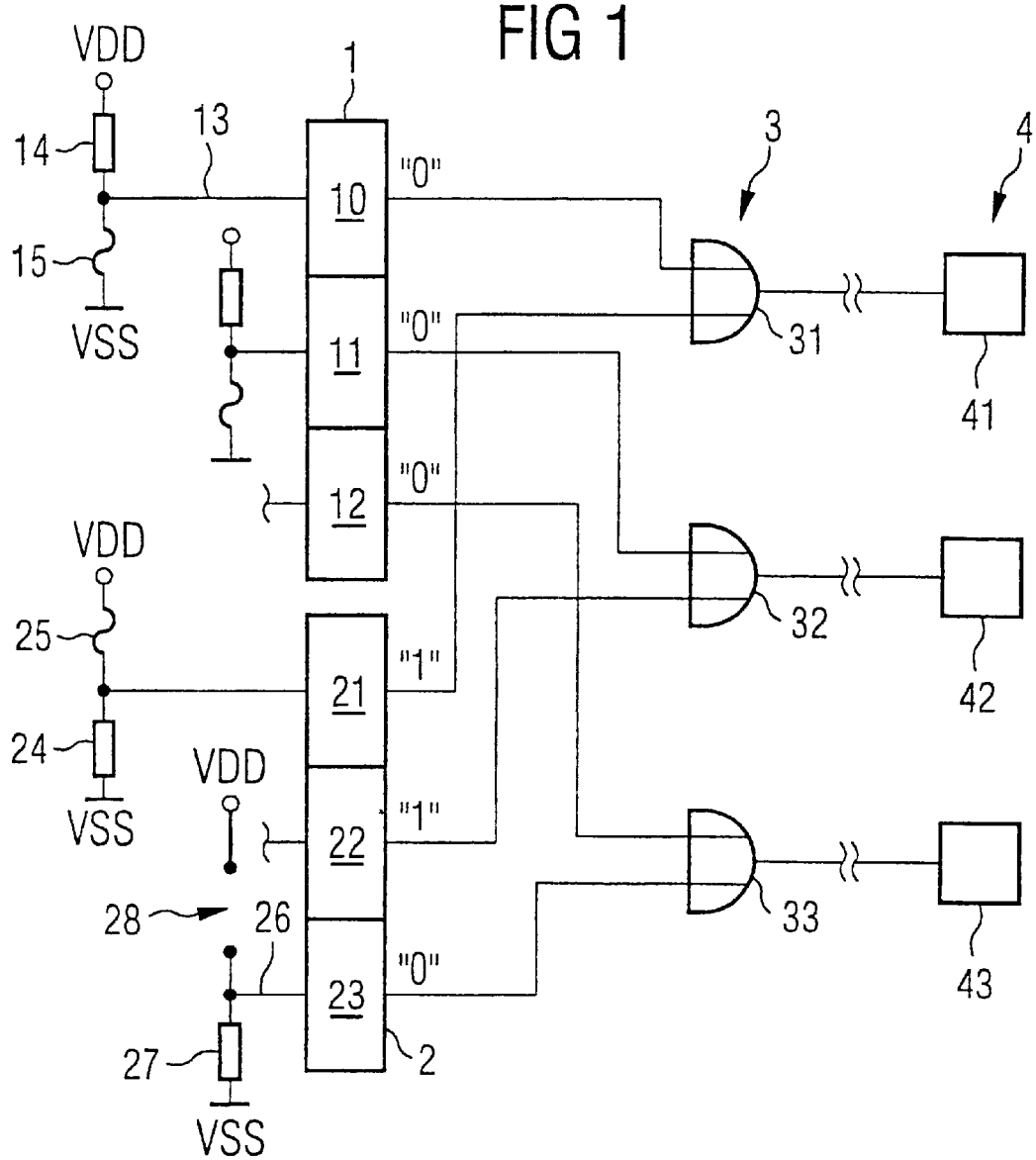
FIG. 1 is a schematic circuit diagram of a circuit that is monolithically integrated on a circuit configuration to be identified.

Referring now to the figures of the drawing in detail and first, particularly, to FIG. 1 thereof, there is shown a circuit configuration for identifying the measured value of an operating parameter of an integrated circuit. The illustrated circuit is monolithically integrated on the integrated circuit. The circuit configuration comprises a first programmable register 1, a second programmable register 2, an OR logic combination 3, which logically combines the register outputs bit by bit, and also output connections 4. Each of the registers comprises three bits. Thus, the register 1 has a first bit 10, a second bit 11 and a third bit 12. As a result, it is possible to distinguish eight different classes of the operating parameter to be set, for example eight speed classes. Each of the register inputs is configured such that it is programmable by means of a laser fuse. By way of example, the connection 13 of the register cell 10, which forms the input of the register cell 10, has a pull-up resistor 14 connected to the positive supply potential VDD, and also a laser fuse 15 connected to the reference-ground potential or ground VSS. The other inputs of the register cells 11, 12 are connected up correspondingly. In the unchanged state, the fuse 15 pulls the connection 13 to ground VSS, with the result that the state "0" is fed to the register cell 10. If the fuse 15 is interrupted (in the figure it is not interrupted) by means of a laser pulse, the input 13 of the register cell 10 is connected to the positive supply potential VDD via the pull-up resistor 14. In this case (not illustrated), the logic value "1" is fed to the register cell 10 on the input side. In the example shown, all three register cells 10, 11, 12 of the register 1 have the logic value "0", i.e. the highest achievable speed class of the integrated circuit in the exemplary embodiment described. This value is also simultaneously preset after the fabrication of the integrated circuit.

In a first test run in conjunction with an automatic test machine, it is ascertained that the integrated circuit functions correctly at the highest available operating frequency, so that the preset value "000" of the register 1 does not have to be altered.

The second register 2 is preset in opposite fashion directly after fabrication and prior to programming. All the register cells have the presetting "111". Thus, the input connection 29 of the first register cell 21 of the register 2 is connected to the positive supply potential VDD via a fuse 25 and to ground VSS via a pull-down resistor 24. This corresponds to the presetting for the first register cell 21 directly after the fabrication of the integrated circuit. The remaining register cells 22, 23 of the register 2 are set in a corresponding manner directly after fabrication and prior to programming.

The integrated circuit is then tested a second time. Under possibly different operating parameters or with a different test program, it is ascertained that the circuit no longer operates without any faults at the highest operating frequency. Instead, it emerges that the circuit operates without any faults only at a lower operating frequency, for example in the seventh lowest speed class. That speed class at which the chip operates fastest without any faults is identified by "000". That speed class which is the lowest when the chip still operates without any faults is identified by "111". In the present example, the second test run reveals that the speed class "110" is applicable, i.e. the seventh lowest speed class.

The register 2 is then programmed correspondingly. The laser fuse 28 of the register cell 23 is severed, with the result that the input connection 26 of the register cell 23 is pulled to ground VSS via the pull-down resistor 27.

The outputs of the registers 1, 2 are ORed bit by bit. For this purpose, the outputs of the register cells 10 and 21 are connected to the inputs of an OR gate 31. In a corresponding manner, the outputs of the register cells 11, 12 are connected to the inputs of an OR gate 32, and the outputs of the register cells 12, 23 are connected to the inputs of an OR gate 33. The outputs of the respective OR gates 31, 32, 33 are connected, if appropriate, via further drivers to output connections 41, 42, 43, so-called connection pads, of the integrated circuit. The signals provided by the OR gates can be interrogated externally via the connection pads 41, 42, 43. As an alternative, the information can also be output to the outside serially via a single pad.

In the example shown, the first register is preset with "000", that is to say the highest speed class, and the second register is preset with "111", that is to say the lowest speed class. Via the OR logic combinations 3, the lowest speed class "111" is preset such that it can be interrogated toward the outside. After the first test run, the register 1 remains unchanged. After the second test run, the register 2 is programmed with the speed class "110". Consequently, after the conclusion of all the tests, the chip is finally identified with the speed class "110". If the speed class "111" represents the lowest speed class, the chip is then identified with the next higher speed class. The speed class is applied later on the housing, when the housing has been completed. By virtue of the fact that the speed class is stored unalterably and securely on the integrated circuit, it is not lost and is available without complicated database interrogations.

Figure 2:
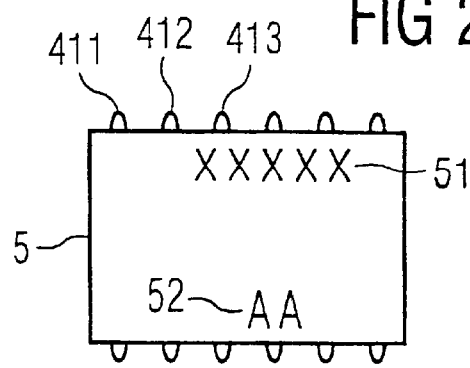
FIG. 2 is a plan view onto a housing of an integrated circuit.

With reference to FIG. 2, there is illustrated a housing of an integrated circuit in plan view. The signals provided at the connection pads 41, 42, 43 can be tapped off at the external connections 411, 412, 413. The housing 5 has a top side on which a type designation 51 is applied for example by laser writing. Moreover, the housing has an alphanumeric identification of the speed class at the position 52. In the exemplary embodiment described, the identification at the position 52 on the housing 5 corresponds to the speed class stored by the digital value "110" in the register 2.

I claim:

1. A method for identifying an operating property of an integrated circuit, which comprises:

ascertaining the operating property of the integrated circuit in a first test run, assigning a first digital identifier value to a first value of the operating property thus ascertained, and permanently storing the first digital identifier value in a first memory element disposed within the integrated circuit;

subsequently ascertaining the operating property again in a second test run, assigning a second digital identifier value to a second value of the operating property thus ascertained, and permanently storing the second digital identifier value in a second memory element disposed within the integrated circuit; and feeding the first digital identifier value being stored and the second digital identifier value being stored to an OR gate and logically combining the digital identifiers in bit-by-bit ORing of bits of the first digital identifier value and the second digital identifier value to form an output identifier, and marking the integrated circuit in dependence on the output identifier.

2. The method according to claim 1, wherein the marking step comprises applying a marking to a housing of the integrated circuit.

3. The method according to claim 1, wherein the operating property ascertained in one of the first test run and the second test run is a clock frequency of the integrated circuit at which the integrated circuit operates without any faults.

4. The method according to claim 3, which comprises, for ascertaining a fault-free operation, feeding input data to the integrated circuit and tapping off output data from the integrated circuit as a response to the input data, and comparing the output data with predetermined comparison data.

5. The method according to claim 1, which comprises, prior to the first test run, presetting memory elements of the integrated circuit to mutually complementary values.

6. A circuit configuration for identifying an operating property of an integrated circuit, wherein at least two test runs of a functional test of the integrated circuit are performed for ascertaining the operating property, and the operating property is identified in dependence on the at least two test runs, comprising:

a first memory element for permanently storing a digital value depending on the first of the test runs, said first memory element having an output; and a second memory element for permanently storing a digital value depending on the second of the test runs, said second memory element having an output; and a logic combination element with a logic OR function, said logic combination element having an input side connected to said output of said first memory element and to said output of said second memory element, and having an output side for outputting a logically combined digital value.

7. The circuit configuration according to claim 6, wherein said output side of said logic combination element is formed with a plurality of outputs for tapping off the logically combined digital value.

8. The circuit configuration according to claim 6, wherein said logic combination element comprises a respective OR gate for each bit position of the digital values, and said OR gates each have an input connected to an output bit of said memory element.

* * * * *